United States Patent
Eguchi et al.

(10) Patent No.: US 8,563,393 B2
(45) Date of Patent: Oct. 22, 2013

(54) METHOD FOR MANUFACTURING SEMICONDUCTOR DEVICE

(75) Inventors: Satoshi Eguchi, Kanagawa (JP); Hitoshi Seshimo, Kanagawa (JP); Naoko Shimizu, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 330 days.

(21) Appl. No.: 13/115,167

(22) Filed: May 25, 2011

(65) Prior Publication Data

US 2011/0294278 A1 Dec. 1, 2011

(30) Foreign Application Priority Data

May 28, 2010 (JP) ................. 2010-122384

(51) Int. Cl.
*H01L 23/544* (2006.01)

(52) U.S. Cl.
USPC .............. 438/401; 438/692; 257/E23.179

(58) Field of Classification Search
USPC ............. 438/401, 692; 257/E23.179
See application file for complete search history.

(56) References Cited

U.S. PATENT DOCUMENTS

| | | | |
|---|---|---|---|
| 8,389,413 B2 * | 3/2013 | Ohuchi | 438/703 |
| 2004/0259320 A1 * | 12/2004 | Holscher et al. | 438/401 |
| 2006/0017180 A1 * | 1/2006 | Sarma | 257/797 |
| 2008/0211063 A1 * | 9/2008 | Adachi et al. | 257/620 |
| 2009/0206398 A1 * | 8/2009 | Yoshikawa et al. | 257/330 |
| 2009/0273102 A1 * | 11/2009 | Nogami et al. | 257/797 |
| 2010/0052191 A1 * | 3/2010 | Trogisch et al. | 257/797 |

FOREIGN PATENT DOCUMENTS

| | | |
|---|---|---|
| JP | 2007-201499 A | 8/2007 |
| JP | 2008-171972 A | 7/2008 |
| JP | 2009-224606 A | 10/2009 |

* cited by examiner

*Primary Examiner* — Savitr Mulpuri

(74) *Attorney, Agent, or Firm* — Miles & Stockbridge P.C.

(57) ABSTRACT

A method for manufacturing a semiconductor device which prevents damage to alignment marks used for alignment between a superjunction structure and process layers at subsequent steps. In the related art, recesses are made in a semiconductor substrate before the formation of the superjunction structure and used as alignment marks and in order to prevent damage to the alignment marks, the alignment marks are covered by an insulating film such as a silicon oxide film during the subsequent process of forming the superjunction structure, but the inventors have found that damage may penetrate the cover film, reach the semiconductor substrate and destroy the marks. In the method according to the invention, alignment marks for alignment between the superjunction structure and process layers at subsequent steps are formed after the formation of the superjunction structure.

12 Claims, 19 Drawing Sheets

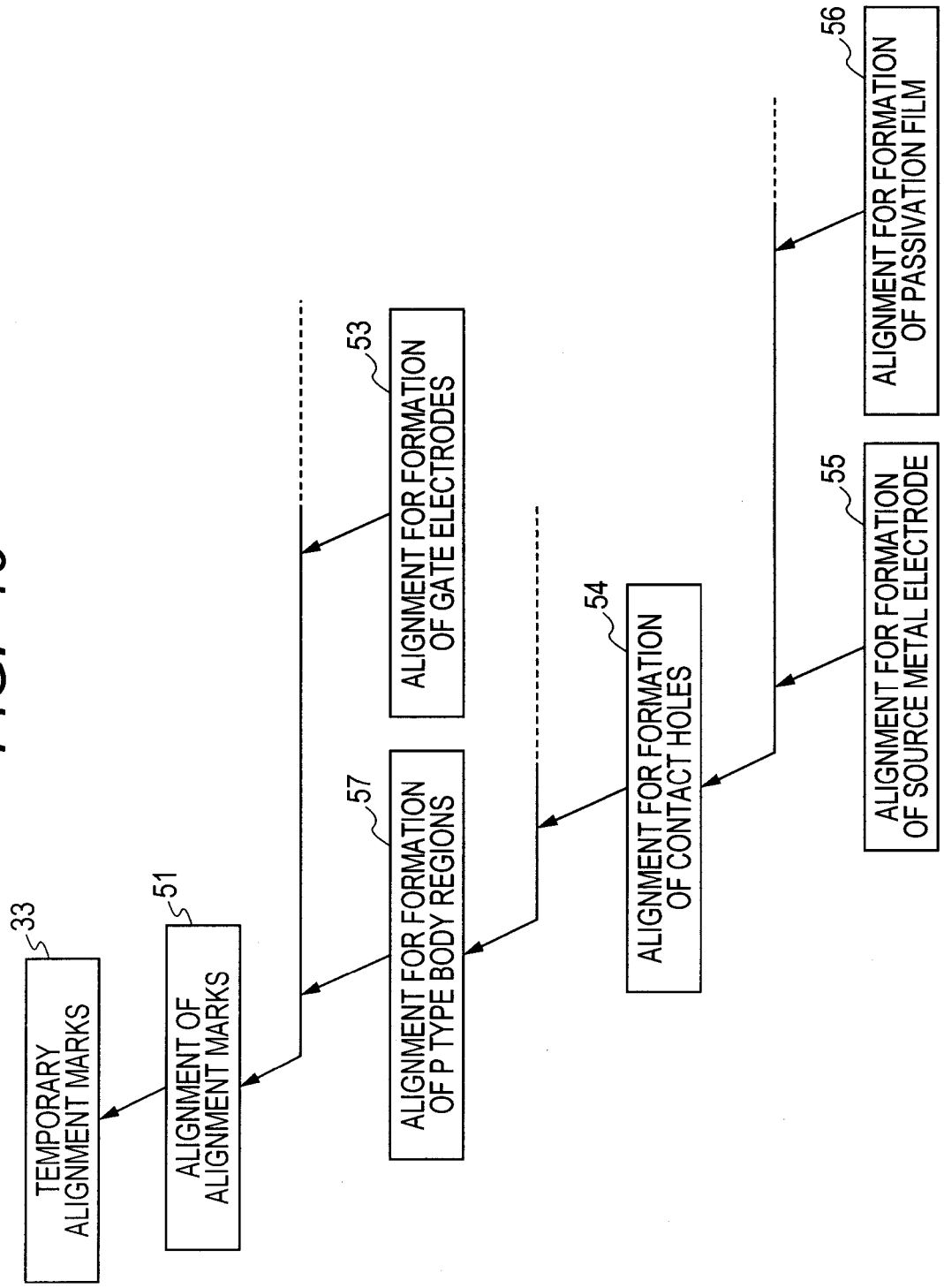

METHOD FOR MANUFACTURING SEMICONDUCTOR DEVICE

CROSS-REFERENCE TO RELATED APPLICATIONS

The disclosure of Japanese Patent Application No. 2010-122384 filed on May 28, 2010 including the specification, drawings and abstract is incorporated herein by reference in its entirety.

BACKGROUND

The present invention relates to technology useful for buried epitaxial growth technology used in a method for manufacturing a semiconductor device (or semiconductor integrated circuit device) and peripheral technology.

Japanese Unexamined Patent Publication No. 2007-201499 discloses a technique which forms a trench for an alignment target before the formation of a trench for a superjunction or forms both trenches virtually at the same time in a process of manufacturing a power semiconductor device.

Japanese Unexamined Patent Publication No. 2008-171972 discloses a technique which forms a trench for an alignment target before the formation of a trench for a superjunction in a process of manufacturing a power semiconductor device.

Japanese Unexamined Patent Publication No. 2009-224606 discloses a technique which forms a trench for an alignment target virtually at the same time as a trench for a superjunction in a process of manufacturing a power semiconductor device.

SUMMARY

In connection with a drift region of a power MOSFET or the like, an important issue is to overcome the silicon limit and develop a high withstand voltage FET with a low on-resistance or the like. In order to address this issue, various methods which use a superjunction structure have been developed, in which the superjunction structure has N-type column regions and P-type column regions which are relatively high concentration slab-type regions and arranged alternately in a drift region. The methods that use such a superjunction structure are roughly classified into three types: multi-epitaxial method, trench insulating film filling method, and trench fill method (trench filling method or trench epitaxial filling method). Among these, the multi-epitaxial method, in which epitaxial growth and ion implantation are repeated many times, provides a high degree of freedom in process and design but its process is complicated and costly. In the trench insulating film filling method, after oblique ion implantation into a trench, the trench is filled with an insulating film by chemical vapor deposition (CVD), so the process is simpler but disadvantageous in terms of area because the trench occupies an area.

On the other hand, the trench fill method is lower in the degree of freedom in process and design due to the limitations for epitaxial growth but has an advantage that the process is simpler. With this background, the present inventors studied the structures of power MOSFETs and similar devices and investigated what should be taken into consideration in the mass production of such devices and have found the following problem.

Since alignment between the superjunction structure and a process layer at a subsequent step is needed, usually recesses are made in the semiconductor substrate before the formation of the superjunction structure and the recesses are used as alignment marks (this method is hereinafter referred to as "alignment mark precedence method"). Then, the alignment marks are covered by an insulating film of silicon oxide, etc. (alignment mark protective film) in order to prevent damage to the alignment marks in the later process of forming the superjunction structure. However, the inventors have demonstrated that damage may penetrate the protective oxide film and reach the silicon substrate and destroy the alignment marks.

The present invention has been made in order to solve the above problem.

An object of the present invention is to provide a process of manufacturing a highly reliable semiconductor device.

The above and further objects and novel features of the invention will more fully appear from the following detailed description in this specification and the accompanying drawings.

A typical aspect of the present invention which is disclosed herein is briefly outlined below.

According to one aspect of the invention, in a method for manufacturing a semiconductor device with a superjunction structure, alignment marks for alignment between the superjunction structure and a process layer at a subsequent step are created after the formation of the superjunction structure.

The advantageous effect achieved by the typical embodiment of the invention is briefly outlined below.

In the method for manufacturing a semiconductor device with a superjunction structure, alignment marks for alignment between the superjunction structure and a process layer at a subsequent step are created after the formation of the superjunction structure, so there is no need for an alignment mark protective film.

BRIEF DESCRIPTION OF THE DRAWINGS

FIG. 19 is an alignment system diagram showing the relations among alignment tasks at different steps of the semiconductor device manufacturing method according to the embodiment.

DETAILED DESCRIPTION

Summary of the Preferred Embodiments

Figure 1:
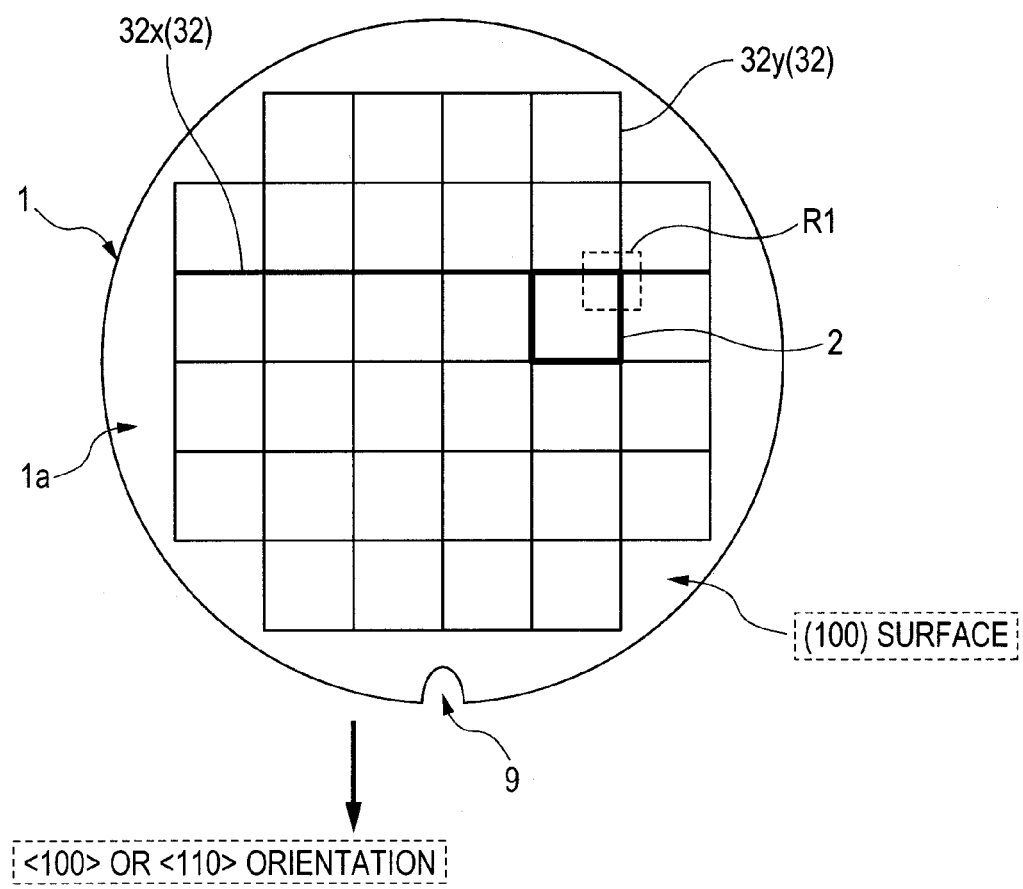
FIG. 1 is a top view of a wafer showing wafer layout in a method for manufacturing a semiconductor device according to an embodiment of the present invention.

First, preferred embodiments of the present invention are outlined below.

1. A method for manufacturing a semiconductor device which includes the following steps: (a) dry etching a first main surface of a semiconductor substrate of a first conductivity type to make many trenches in the main surface of the semiconductor substrate; (b) forming a buried epitaxial layer over the first main surface of the semiconductor substrate through buried epitaxial growth in the first main surface by filling the trenches with an epitaxial layer of a second conductivity type, opposite to the first conductivity type; (c) performing a first planarization process on the first main surface by removing the buried epitaxial layer over the first main surface of the semiconductor substrate except the trenches so that a first group of trenches among the filled trenches, along with the semiconductor substrate of the first conductivity type around them, make up a super-junction structure; (d) after the above step (c), forming an alignment mark in the first main surface of the semiconductor substrate; and (e) after the above step (d), performing alignment using the alignment mark.

2. In the method for manufacturing a semiconductor device as described above in 1, the alignment mark includes a recess made in the first main surface of the semiconductor substrate.

3. In the method for manufacturing a semiconductor device as described above in 1 or 2, the dry etching at the step (a) and the buried epitaxial growth at the step (b) are performed while a hard mask film lies over the first main surface of the semiconductor substrate.

4. The method for manufacturing a semiconductor device as described above in any one of 1 to 3, further includes the steps of, (f) after the step (c) and before the step (d), performing alignment for the step (d) using a second group of trenches among the many trenches as temporary alignment marks.

5. In the method for manufacturing a semiconductor device as described above in 3 or 4, the hard mask film includes a silicon oxide insulating film as a main component.

6. The method for manufacturing a semiconductor device as described above in any one of 3 to 5, further includes the step of (g), after the step (d) and before the step (e), removing the hard mask film.

7. The method for manufacturing a semiconductor device as described above in any one of 3 to 6, further includes the step of (h) performing a second planarization process on the first main surface of the semiconductor substrate to eliminate a level difference in the first main surface of the semiconductor substrate resulting from the removal of the hard mask film at the step (g).

8. The method for manufacturing a semiconductor device as described above in 7, further includes the step of (i) measuring the depth of the recess before and after the second planarization process at the step (h).

9. The method for manufacturing a semiconductor device as described above in 8, further includes the step of (j) controlling an amount of polishing in the second planarization process at the step (h) based on a result of measurement of the depth of the recess before and after the second planarization process at the step (i).

10. In the method for manufacturing a semiconductor device as described above in any one of 4 to 9, the second group of trenches among the many trenches are located separately from the first group of trenches among the many trenches.

11. In the method for manufacturing a semiconductor device as described above in any one of 4 to 10, the second group of trenches among the many trenches are located adjacent to the alignment marks.

12. In the method for manufacturing a semiconductor device as described above in any one of 1 to 11, the alignment marks have a plurality of linear recesses arranged virtually parallel.

13. In the method for manufacturing a semiconductor device as described above in any one of 4 to 12, the alignment process at the step (e) is an alignment process for patterning to form a gate electrode.

14. In the method for manufacturing a semiconductor device as described above in any one of 4 to 13, optical level differences around the temporary alignment marks on a flat surface subjected to the first planarization are used in performing alignment using the temporary alignment marks.

Rules of Description in the Specification

1. The preferred embodiments may be described separately in different sections as necessary, but such descriptions are not irrelevant to each other unless otherwise specified. One description may be, in part, a detailed form of another or one description may be, in whole or in part, a variation of what is described in another. Basically, the same explanations are not repeated. In the preferred embodiments, even when a specific numerical value is indicated for an element, the numerical value is not essential for the element unless otherwise specified or unless limited to the numerical value theoretically or obviously in the context.

Here the term "semiconductor device" mainly refers to various discrete transistors (active devices) or semiconductor chips or the like (for example, single-crystal silicon substrates) on which resistors and capacitors are integrated with such transistors. Among such transistors are typically MISFETs (Metal Insulator Semiconductor Field Effect Transistors) including MOSFETs (Metal Oxide Semiconductor Field Effect Transistors). The present invention is intended to be applied to power semiconductor devices and here the term "power semiconductor device" mainly refers to many types of semiconductor devices which deal with electric power of 5 watts or more, such as power MOSFETs, IGBTs (Insulated Gate Bipolar Transistors), power diodes and composite devices which include at least one of these devices.

2. When a material or composition in an embodiment of the invention is described, the expression "X comprising A" or "X which comprises A" does not exclude a main component other than A unless otherwise specified or unless exclusion of another component is obvious in the context. If the expression concerns a component, it means "X which includes A as a main component". For example, the term "silicon member" represents not only a member made of pure silicon but also a member made of a multi-component alloy which contains SiGe alloy or another type of silicon as a main component or a member which includes another additive. Similarly, the terms "silicon oxide film," "silicon oxide insulating film" and so on obviously refer to not only relatively pure undoped silicon dioxide film but also thermally oxidized film, CVD oxidized film or SOG (Spin ON Glass) film of FSG (Fluorosilicate Glass), TEOS-based silicon oxide, SiOC (Silicon Oxicarbide), carbon-doped silicon oxide, OSG (Organosilicate glass), PSG (Phosphorus Silicate Glass) or BPSG (Borophosphosilicate Glass), or NCS (Nano-Clustering Silica) coating type oxide silicon, silica low-k insulating film with vacant holes in a similar material (porous insulating film) or film which contains any of them as a main component and is combined with another silicon insulating film.

Along with silicon oxide insulating film, silicon nitride insulating film is commonly used as a silicon insulating film in the semiconductor field. Materials for this type of film include SiN, SiCN, SiNH, and SiCNH. The term "silicon nitride" here includes both SiN and SiNH unless otherwise specified.

3. Similarly, preferred examples of figures, positions, and attributes are shown here; however it is needless to say that they are not limited to these examples in a strict sense unless otherwise specified or unless obviously limited so in the context.

4. Also, even when a volume or value is indicated by a specific numerical value, it is not limited to the specific numerical value unless otherwise specified or unless limited to the numerical value theoretically or obviously in the context; it may be larger or smaller than the specific numerical value.

5. The term "wafer" generally refers to a single-crystal silicon wafer on which a semiconductor device (including a semiconductor integrated circuit device or electronic device) is formed. However, obviously it also includes a wafer which combines an insulating substrate, such as an epitaxial wafer, SOI substrate or LCD glass substrate, and a semiconductor layer.

6. Generally a superjunction structure is a structure that in a conductive semiconductor region with positive or negative polarity, pillar or plate-like column regions with opposite polarity are inserted at virtually regular intervals so as to maintain charge balance. In the present invention, when reference is made to a "superjunction structure" formed by a trench fill method, basically it should be interpreted to be a structure that in a conductive semiconductor region with positive or negative polarity, plate-like "column regions" with opposite polarity (usually plate-like but, in some cases, curved or bent) are inserted at virtually regular intervals so as to maintain charge balance. In the preferred embodiments described below, P type columns are formed at regular intervals and parallel to each other in an N type semiconductor layer (for example, drift region). Therefore, as for the expression "superjunction structure is exposed on a chip lateral side", it means not only that P type column regions are exposed but also that regions which function as P type column regions or N type column regions are exposed on the chip lateral side.

In the present invention, the term "drift region" refers not only to an epitaxial layer portion which serves as a current path when a power semiconductor device such as a power MOSFET is On, but also to a peripheral epitaxial layer portion (including P type column regions or N type column regions) which contributes to maintaining a reverse withstand voltage when the power semiconductor device is Off.

7. In the present invention, for example, when (100) or a similar symbol is used to describe a crystal surface, it also includes a crystal surface equivalent to it. Similarly, <100>, <110> or a similar symbol is used to describe a crystal orientation, it also includes a crystal orientation equivalent to it.

Details of the Preferred Embodiments

The preferred embodiments are further described in detail below. In the drawings, like or similar elements are designated by like or similar symbols or reference numerals and descriptions of such elements are not repeated.

In the drawings, in some cases, hatching is omitted even for a cross section if hatching may make the illustration complicated or it can be clearly distinguished from a void space. In this connection, even for a closed hole in a plan view the background contour line may be omitted as far as it is clear from an explanation, etc. Furthermore, in a drawing, even if an area is not a cross section, it may be indicated by hatching in order to show that it is not a void space.

Among related patent applications which disclose a power MOSFET using a superjunction structure are Japanese Patent Application NO. 2009-263600 (filed on Nov. 19, 2009 in Japan) and Japanese Patent Application No. 2010-81905 (filed on Mar. 31, 2010 in Japan).

1. Description of the planar layout, chip peripheral area layout, on-wafer element arrangement, and alignment system of a power MOSFET as an example of a semiconductor device according to an embodiment of the present invention (see FIGS. 1 to 3 and FIG. 19.)

The example which is concretely explained below is a planar power MOSFET formed on a silicon semiconductor substrate with a source/drain withstand voltage of 600 volts or so (the planar power MOSFETs described hereinafter are the same as this one). However, it is needless to say that what is discussed below is true for any other power MOSFET with a different withstand voltage.

Figure 2:
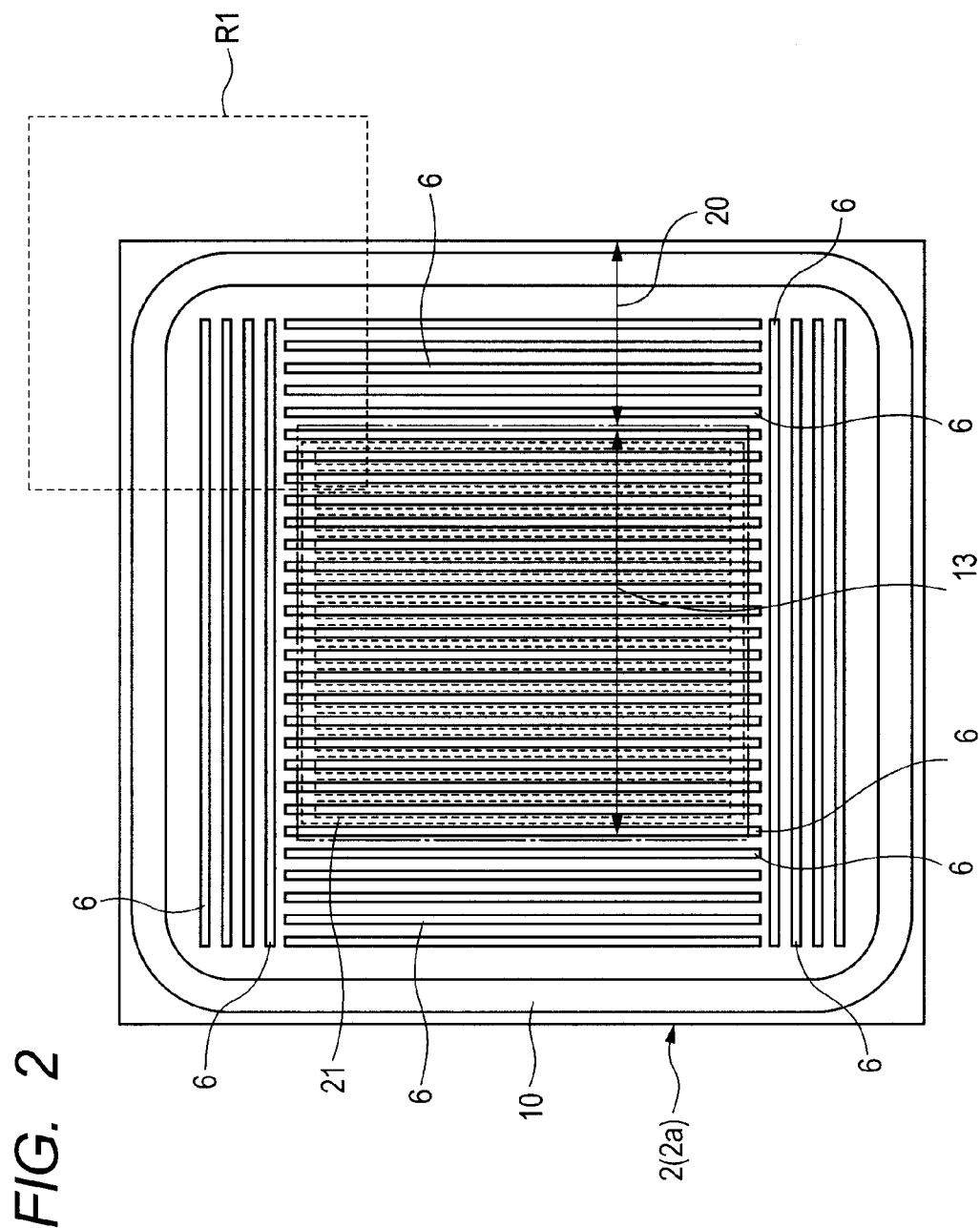
FIG. 2 is a top view of a chip of a power MOSFET as an example of a semiconductor device to be manufactured by the method according to the embodiment.
Figure 3:
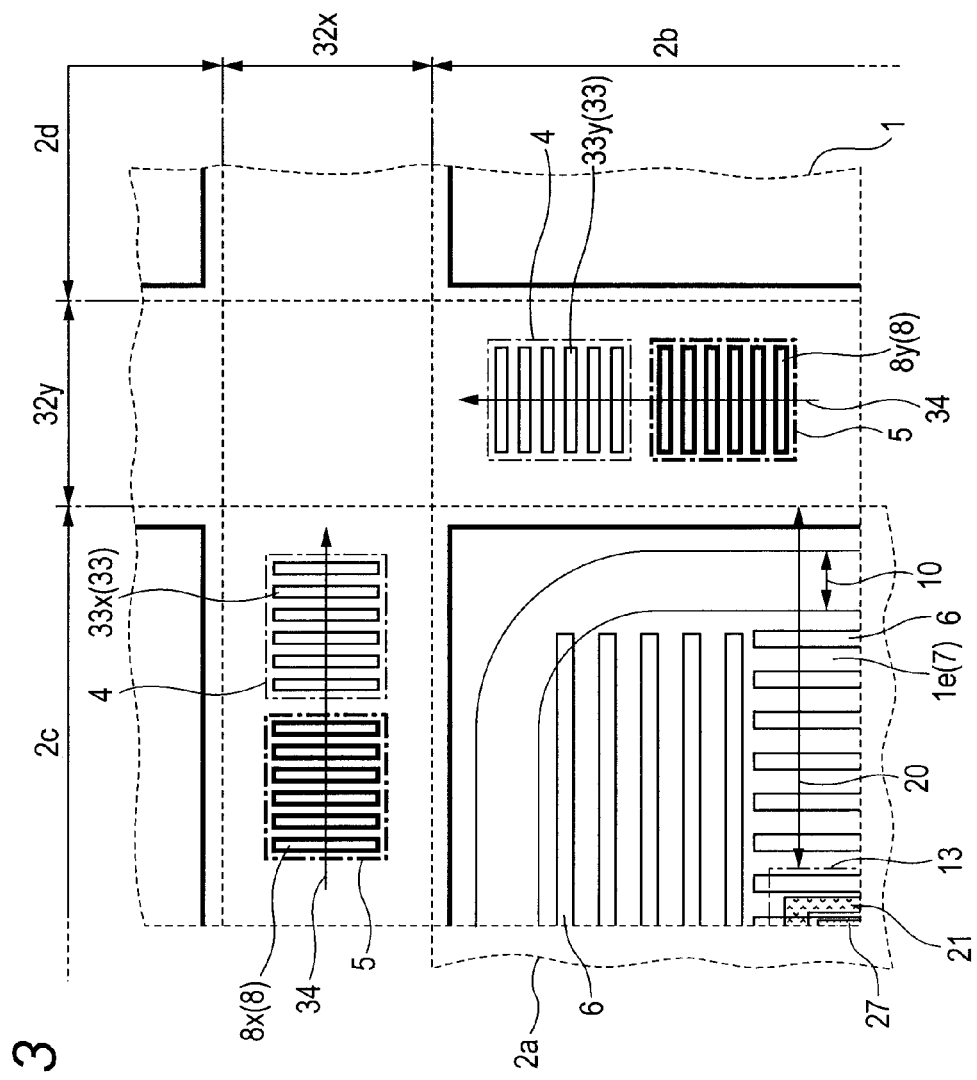
FIG. 3 shows the planar layout of peripheral part R1 in a chip corner as shown in FIGS. 1 and 2.

FIG. 1 is a top view of a wafer showing an on-wafer layout in the method for manufacturing a semiconductor device according to an embodiment of the invention. FIG. 2 is a top view of the chip of a power MOSFET as a semiconductor device to be manufactured by the method according to the embodiment. FIG. 3 shows the planar layout of peripheral part R1 in a chip corner as shown in FIGS. 1 and 2. FIG. 19 is an alignment system diagram showing the relations among alignment tasks at different steps of the semiconductor device manufacturing method according to the embodiment. Referring to these figures, the planar layout, chip peripheral area layout, on-wafer element arrangement, and alignment system of the power MOSFET as an example of the semiconductor device according to the embodiment of the present invention are described next.

FIG. 1 shows the layout of a chip region 2 of the device main surface 1a of a wafer 1 (if the wafer diameter is 200 mm and each chip is 3 mm square, actually the number of chips on the wafer will be about 100 times as many as shown here, but for illustration convenience, the chip size is exaggerated here). As shown in FIG. 1, many chip regions 2 or areas to be chip regions are arranged almost in a matrix pattern on the front main surface 1a of the wafer 1 (device main surface, source side main surface, namely first main surface) in which they are separated from each other by scribe line regions 32 (X scribe line regions 32x and Y scribe line regions 32y) orthogonally crossing in the X and Y directions. In this example, the crystal surface of the front main surface 1a of the wafer 1 is, for example, (100) and the crystal orientation of a notch 9 is, for example, <100> or <110> (obviously there is no problem that the crystal surface and orientation are different from these).

FIG. 2 shows the overall planar layout of the upper surface (corresponding to the front main surface 1a of the wafer 1) of the chip 2 (chip region) which is almost completed (for easy understanding, the chip inner metal layer is omitted in the figure). As shown in FIG. 2, the chip 2 (2a) has the shape of almost a square or near-square rectangle in which a guard ring 10 lies in a chip peripheral region 20 and an active cell region 13 lies in the center. A polysilicon film (gate electrode) 21 as a multiply-connected structure (in the form of a sheet with many holes of the same shape) lies in the active cell region 13 and many P type column regions 6 lie in the whole active cell region 13 and a specific portion of the chip peripheral region 20.

FIG. 3 shows peripheral part R1 in one of the chip corners shown in FIGS. 1 and 2. As shown in FIG. 3, a P+ type body contact region 27 lies in the active cell region 13 of the chip region 2a and many P type column regions 6 are formed in an N type silicon epitaxial layer 1e from the active cell region 13 to the chip peripheral region 20. These P type column regions 6 and N type column regions 7 (N type silicon epitaxial layer 1e) between P type column regions 7 make up a superjunction structure. The chip region 2a adjoins a chip region 2b with a Y scribe line region 32y between them and adjoins a chip region 2c with an X scribe line region 32x between them, and adjoins a chip region 2d with the intersection of the scribble line regions 32x and 32y between them. In each of the scribe line regions 32x and 32y, there is provided an alignment mark region 5 (for example, 36×32 micrometers) for the formation of alignment marks 8 used for alignment between the superjunction structure and a process layer at a subsequent step and also provided adjacent to it a temporary alignment mark region 4 (for example, 36×32 micrometers) for the formation of temporary alignment marks 33 as auxiliary alignment marks for the formation of alignment marks 8. The alignment mark region 5 of the X scribe line region 32x contains X alignment marks 8x and the alignment mark region 5 of the Y scribe line region 32y contains Y alignment marks and the temporary alignment mark regions 4 adjacent to them contain X temporary alignment marks 33x and Y temporary alignment marks 33y respectively. An alignment task (position detection and alignment) is performed by scanning these alignment marks with a laser beam, for example, along an alignment laser scan path 34.

It is desirable that each temporary alignment mark region 4 (a second group of buried trenches) be adjacent to an alignment mark region 5. Also from the viewpoint of alignment convenience, it is desirable that the second group of buried trenches is located in a different position from the position of the first group of buried trenches (a group of P type column regions which configure the superjunction). Furthermore, it is preferable that the alignment marks (recesses) 8 and temporary alignment marks be disposed in a line- and space pattern, specifically slit-like lines with the same width (three-dimensionally, plural linear recesses) be arranged at regular intervals in a plan view.

Next, the alignment system for the whole wafer process is summarized referring to FIG. 19. As shown in FIG. 19, in this embodiment, the alignment marks 8 for alignment between the superjunction structure and a process layer at a subsequent step are aligned to temporary alignment marks 33 formed in the course of forming the superjunction structure (step 51 in which alignment marks for alignment between the superjunction structure and a subsequent process layer are aligned). The alignment marks 8 are used for alignment at immediately subsequent processing steps, for example, an alignment step 57 for the formation of gate electrodes and an alignment step 53 for the formation of P type body regions. As for further subsequent processing steps, for example, the alignment marks formed at the step of forming gate electrodes are used, for example, for alignment at an alignment step 54 for the formation of contact holes. At further subsequent steps, for example, an alignment step 55 for the formation of a source metal electrode and an alignment step 56 for the formation of a final passivation film, the alignment marks formed in the course of making contact holes are used for alignment.

2. Description of the wafer process in the semiconductor device manufacturing method according to the embodiment (see FIG. 4 and FIGS. 18 and 19).

Figure 4:
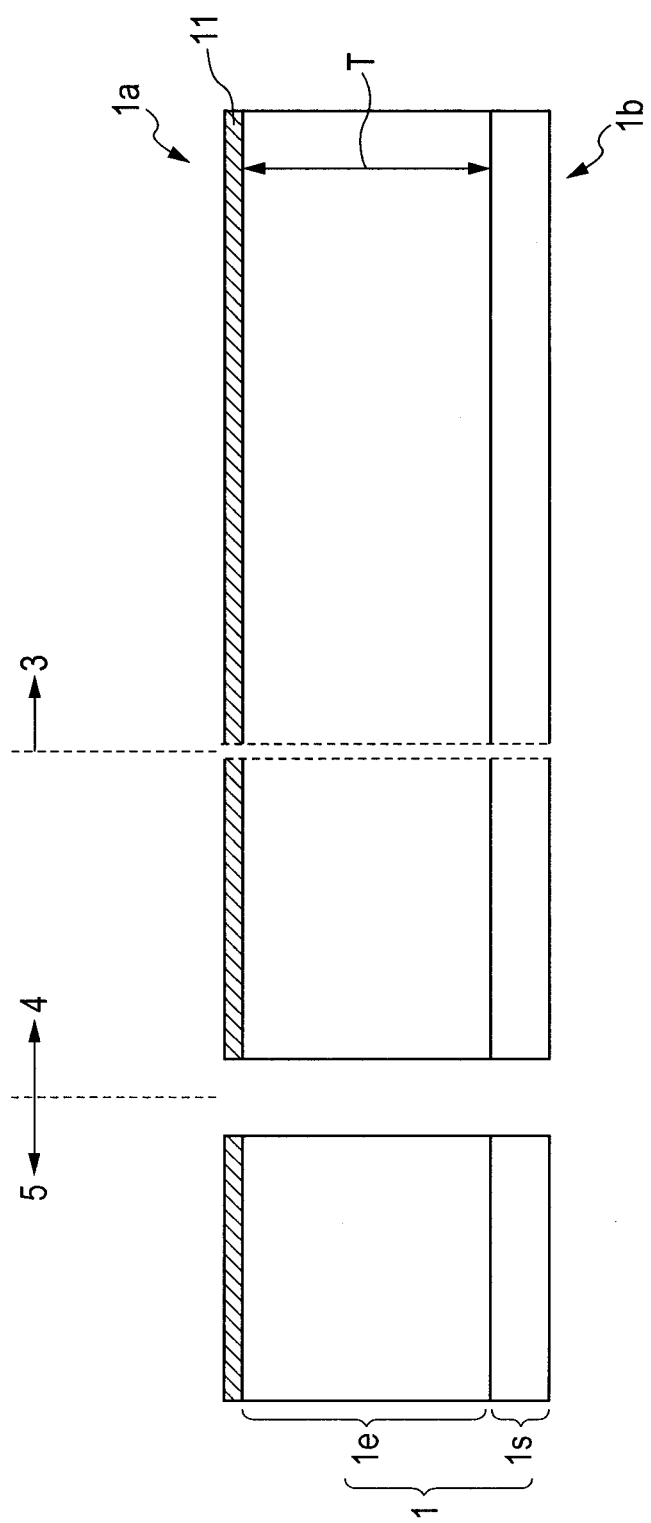
FIG. 4 is a sectional view showing a device region, temporary alignment mark region, and alignment mark region at a wafer processing step (step of making a hard mask film for trench etching) in the semiconductor device manufacturing method according to the embodiment.
Figure 5:
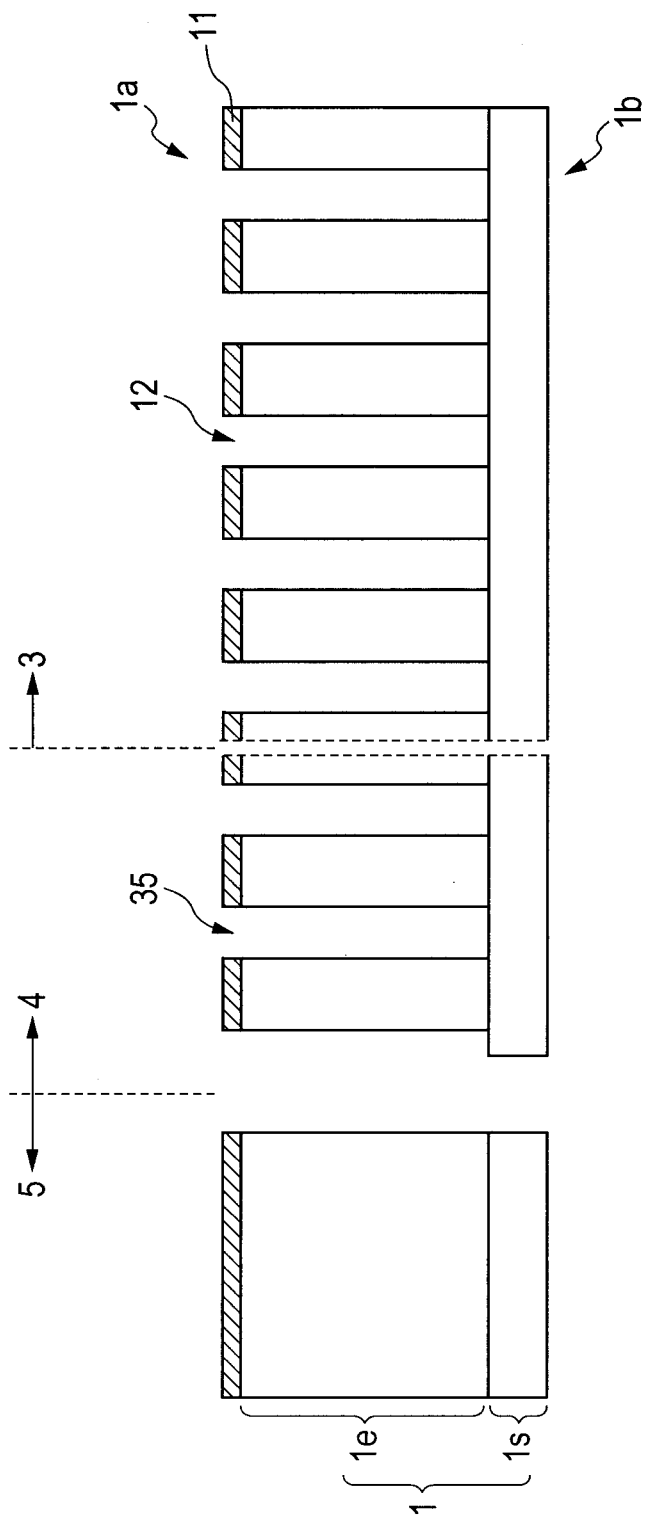
FIG. 5 is a sectional view showing the device region, temporary alignment mark region, and alignment mark region at wafer processing step (trench etching step) in the semiconductor device manufacturing method according to the embodiment.
Figure 6:
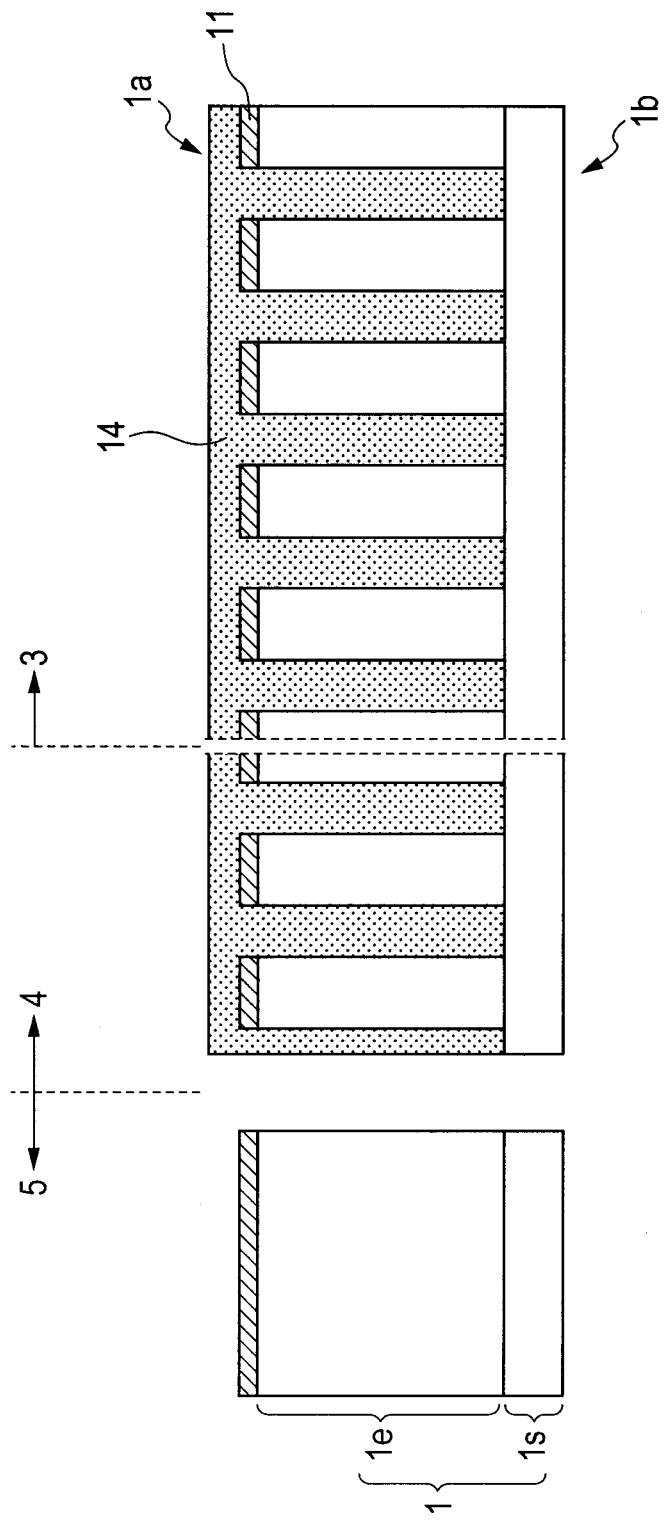
FIG. 6 is a sectional view showing the device region, temporary alignment mark region, and alignment mark region at wafer processing step (trench filling step) in the semiconductor device manufacturing method according to the embodiment.
Figure 7:
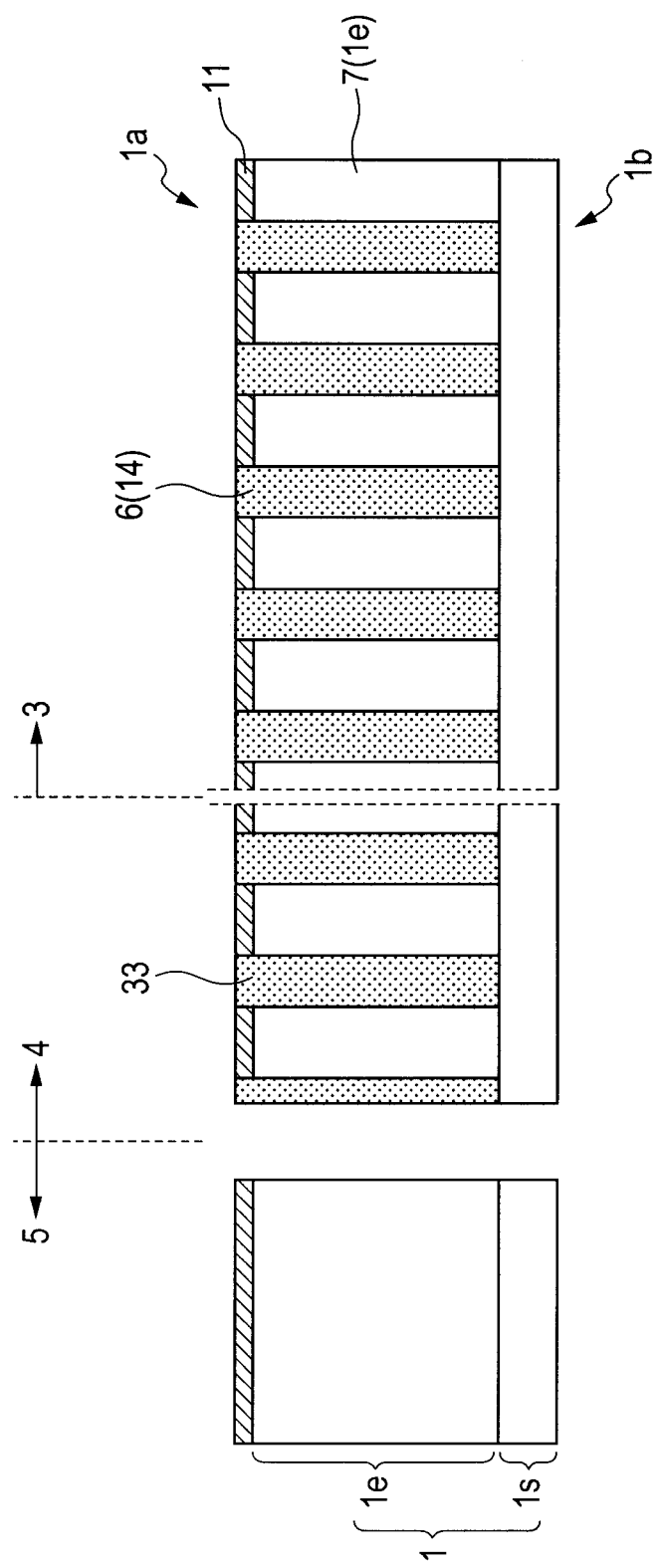
FIG. 7 is a sectional view showing the device region, temporary alignment mark region, and alignment mark region at a wafer processing step (first planarization step) in the semiconductor device manufacturing method according to the embodiment.
Figure 8:
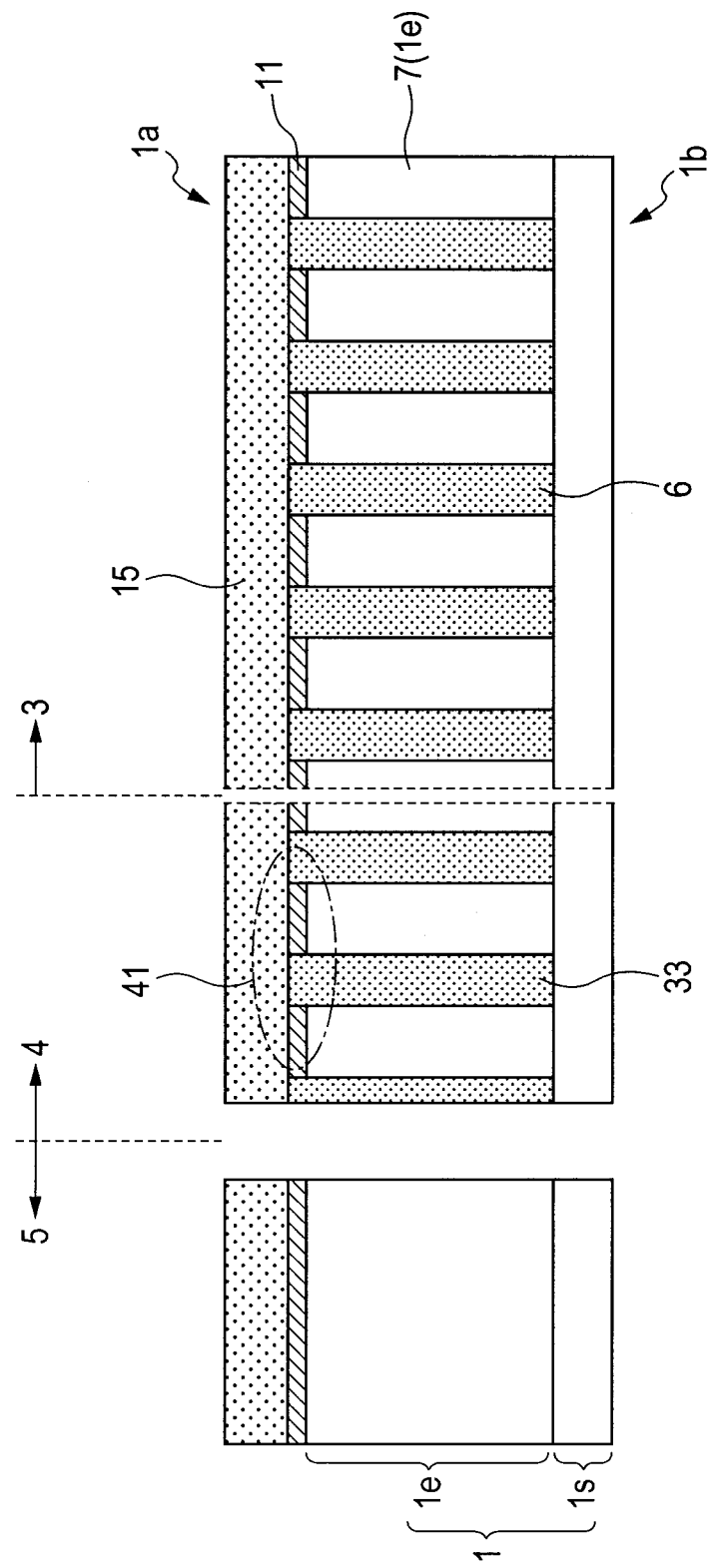
FIG. 8 is a sectional view showing the device region, temporary alignment mark region, and alignment mark region at a wafer processing step (resist film coating step for creating alignment marks) in the semiconductor device manufacturing method according to the embodiment.
Figure 9:
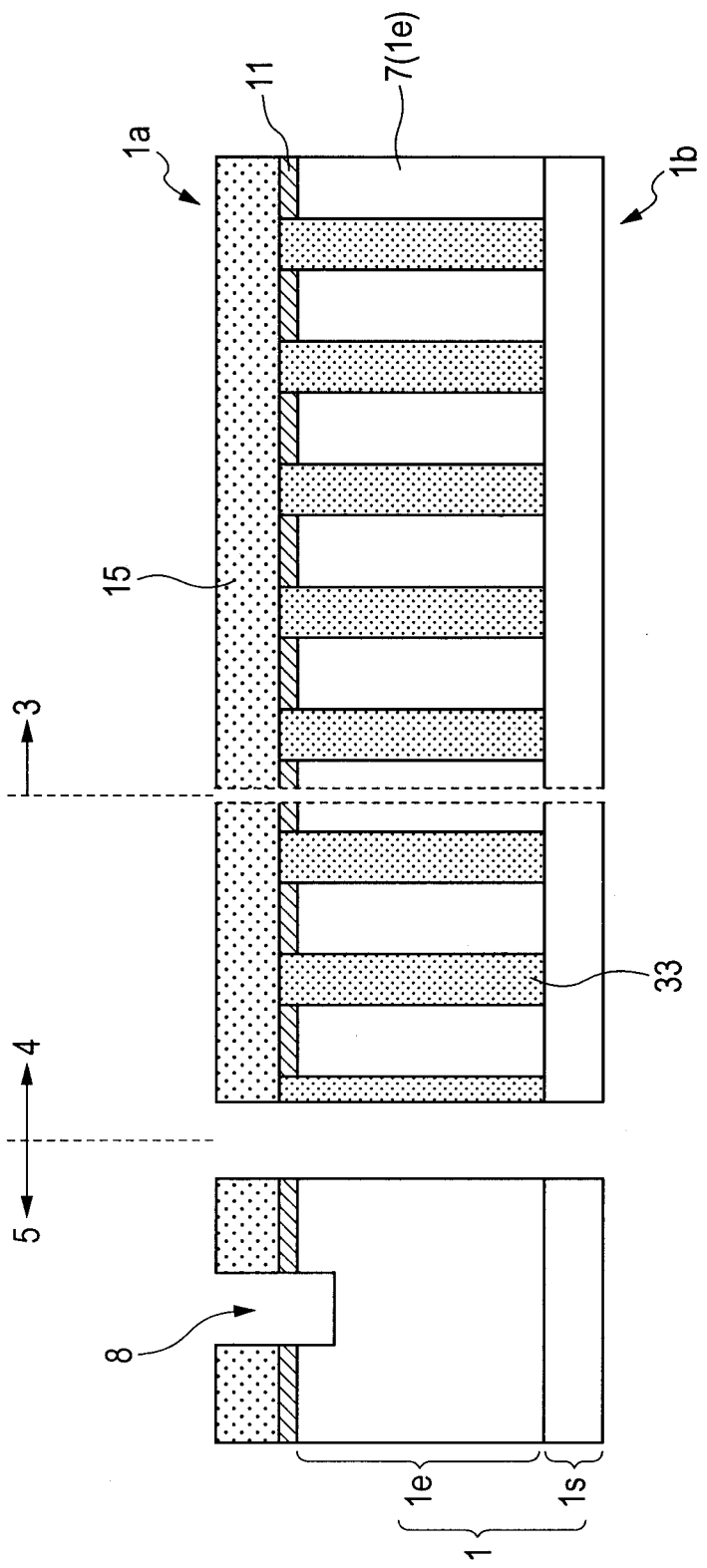
FIG. 9 is a sectional view showing the device region, temporary alignment mark region, and alignment mark region at a wafer processing step (step of creating alignment marks) in the semiconductor device manufacturing method according to the embodiment.
Figure 10:
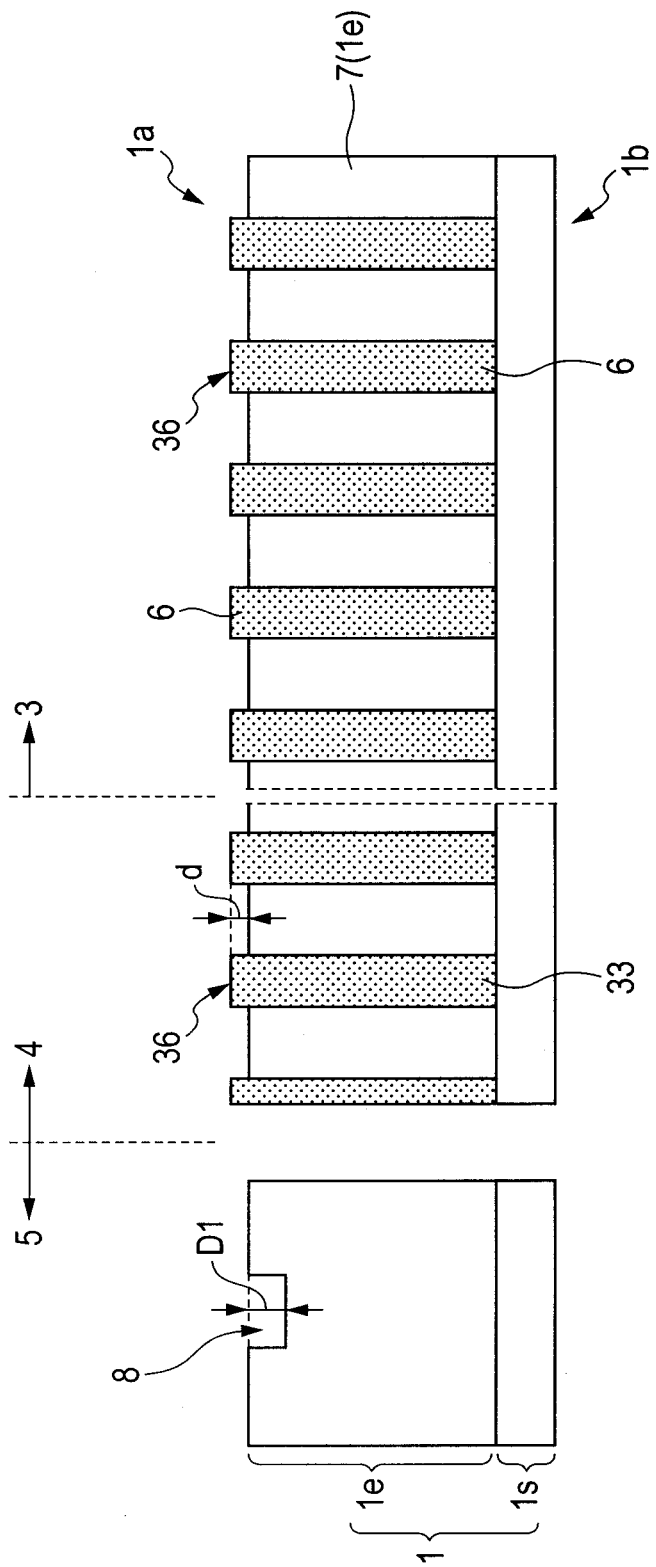
FIG. 10 is a sectional view showing the device region, temporary alignment mark region, and alignment mark region at a wafer processing step (step of removing the hard mask) in the semiconductor device manufacturing method according to the embodiment.
Figure 11:
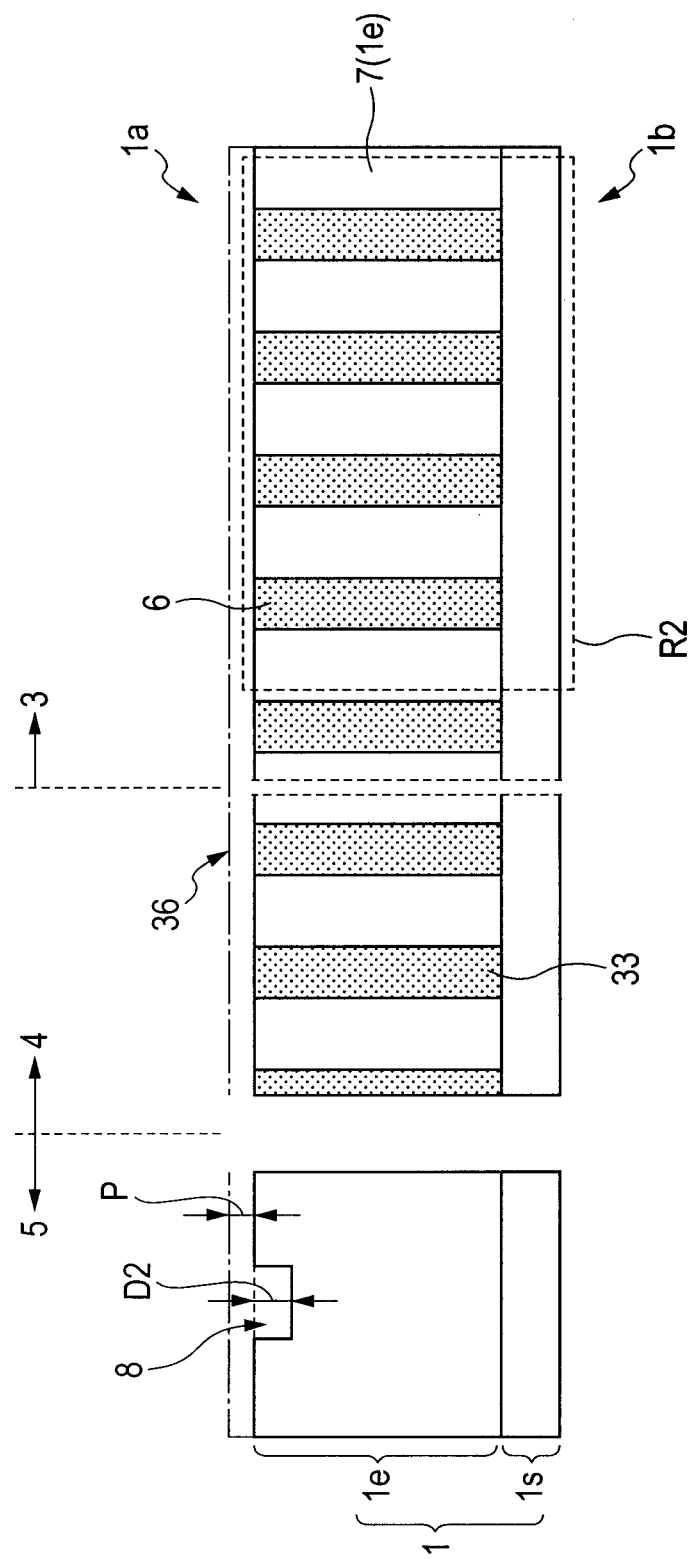
FIG. 11 is a sectional view showing the device region, temporary alignment mark region, and alignment mark region at a wafer processing step (second planarization step) in the semiconductor device manufacturing method according to the embodiment.
Figure 12:
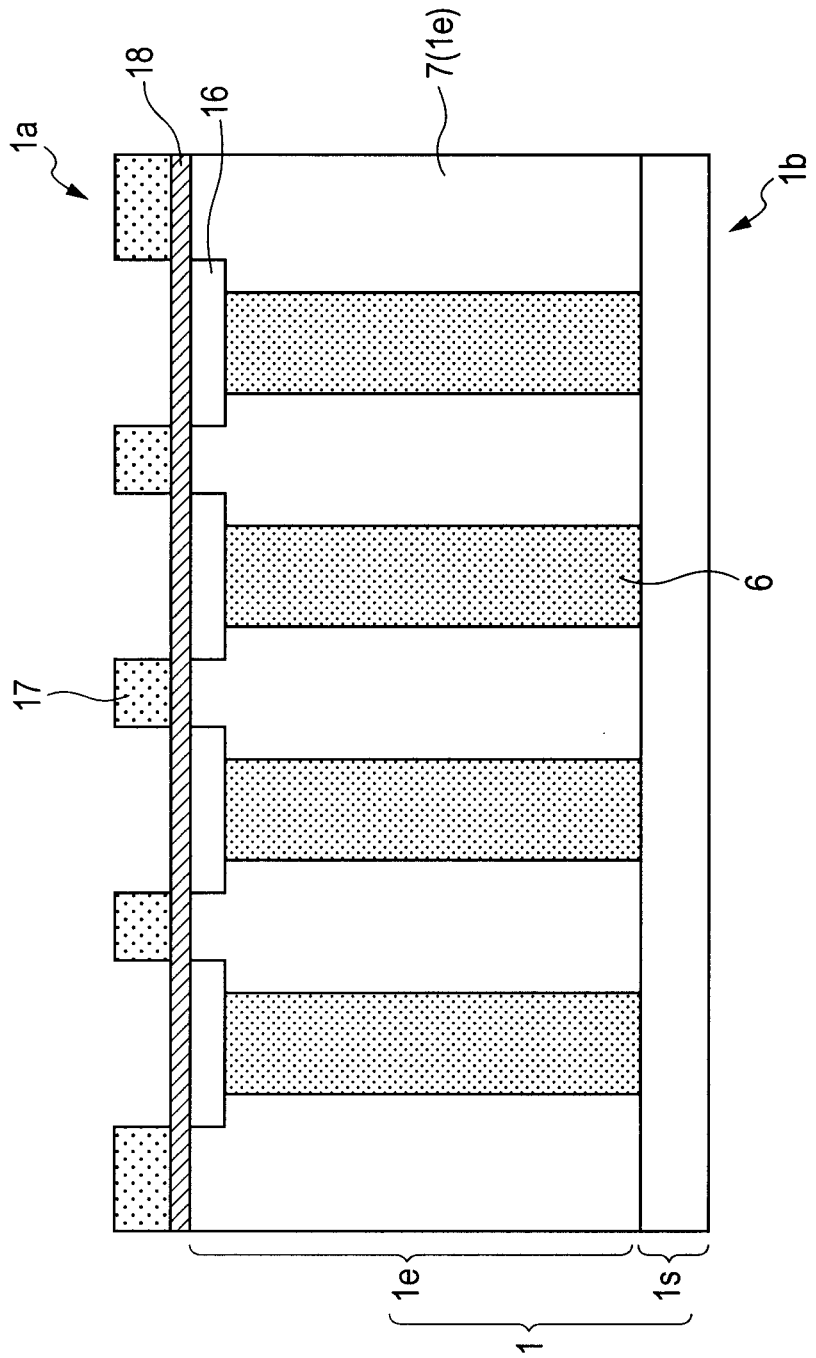
FIG. 12 is a sectional view showing active cell part R2 of the device region shown in FIG. 11 at a subsequent wafer processing step (step of forming P type body regions)
Figure 13:
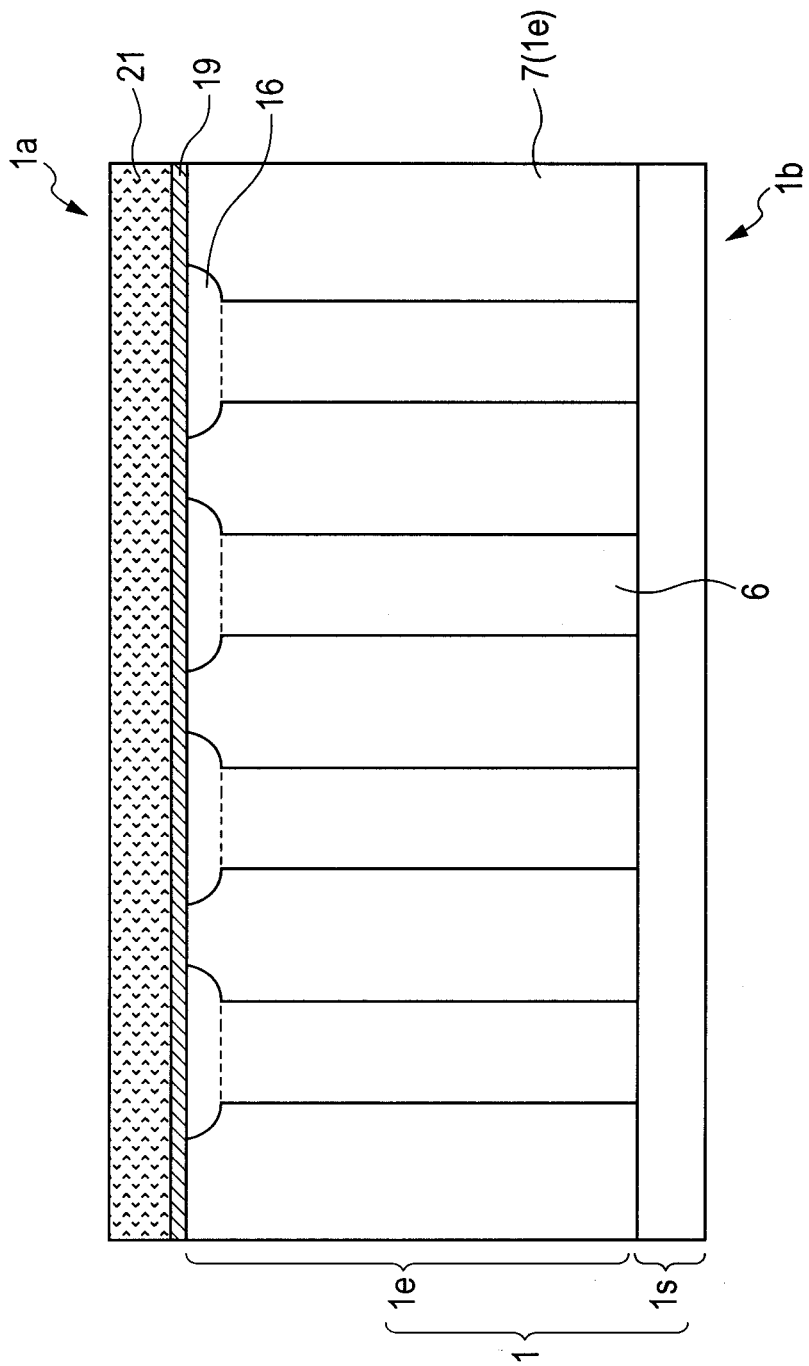
FIG. 13 is a sectional view showing the active cell part R2 of the device region shown in FIG. 11 at a subsequent wafer processing step (step of forming a gate polysilicon film)
Figure 14:
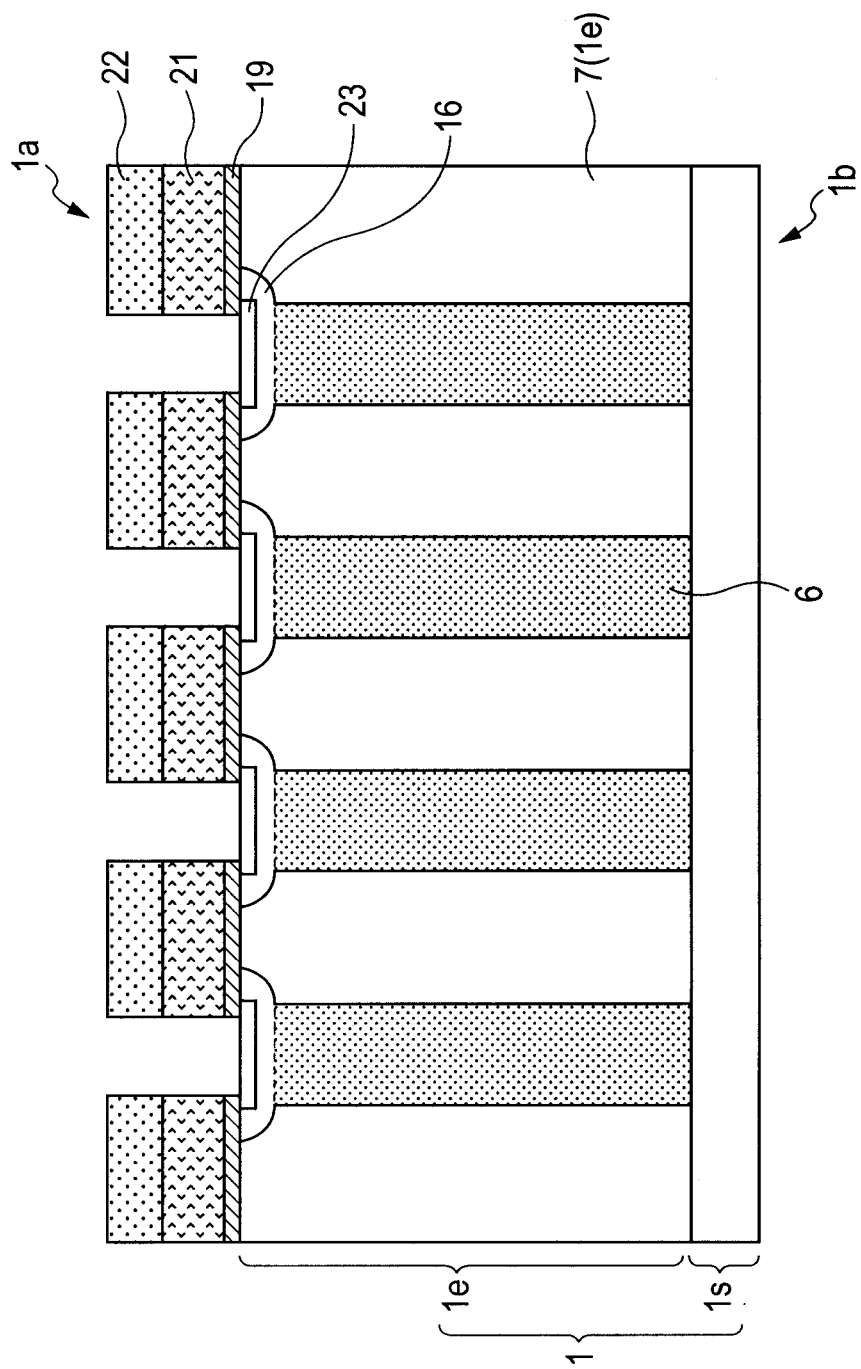
FIG. 14 is a sectional view showing the active cell part R2 of the device region shown in FIG. 11 at a subsequent wafer processing step (step of patterning the gate polysilicon film)
Figure 15:
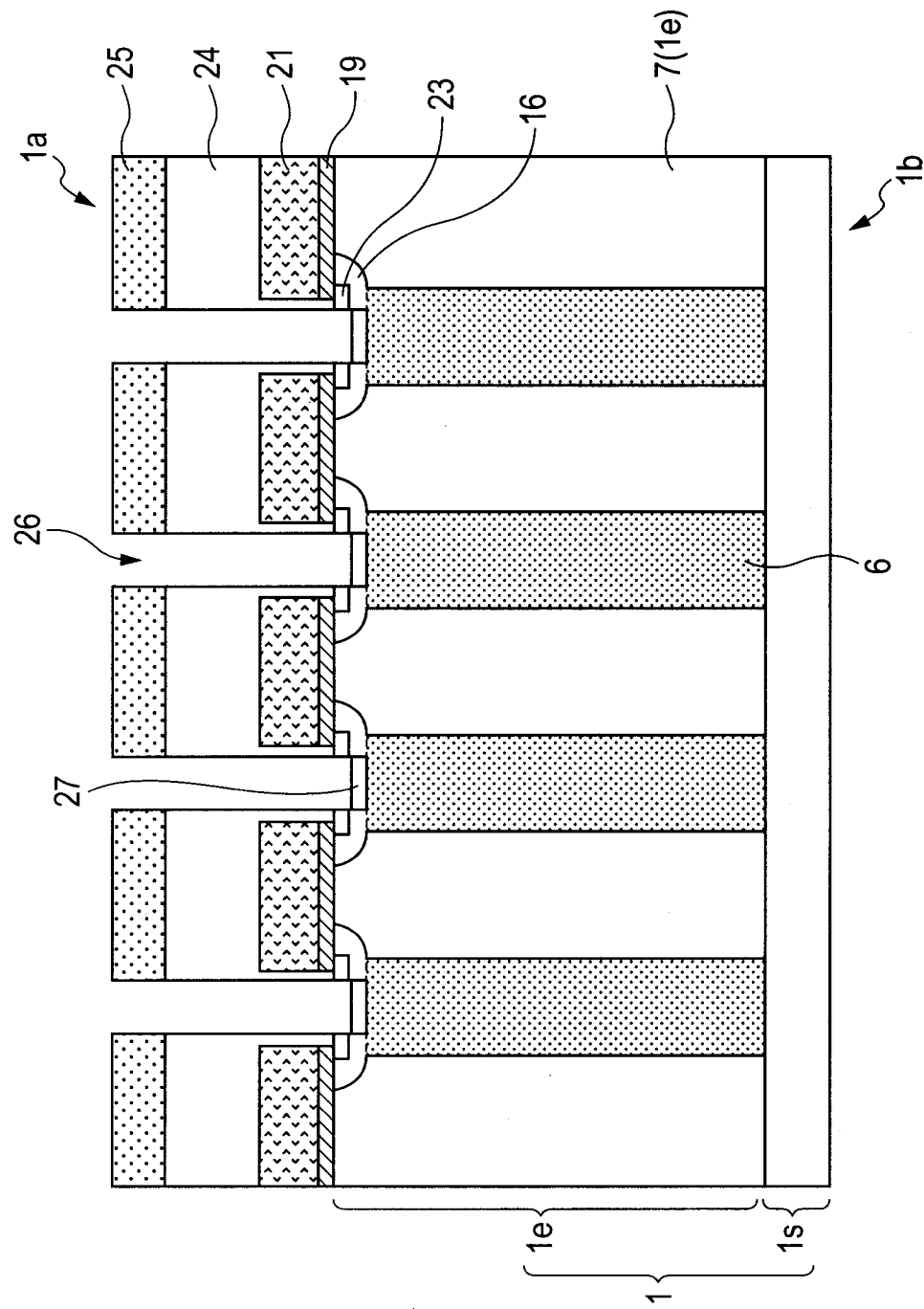
FIG. 15 is a sectional view showing the active cell part R2 of the device region shown in FIG. 11 at a subsequent wafer processing step (step of making contact holes)
Figure 16:
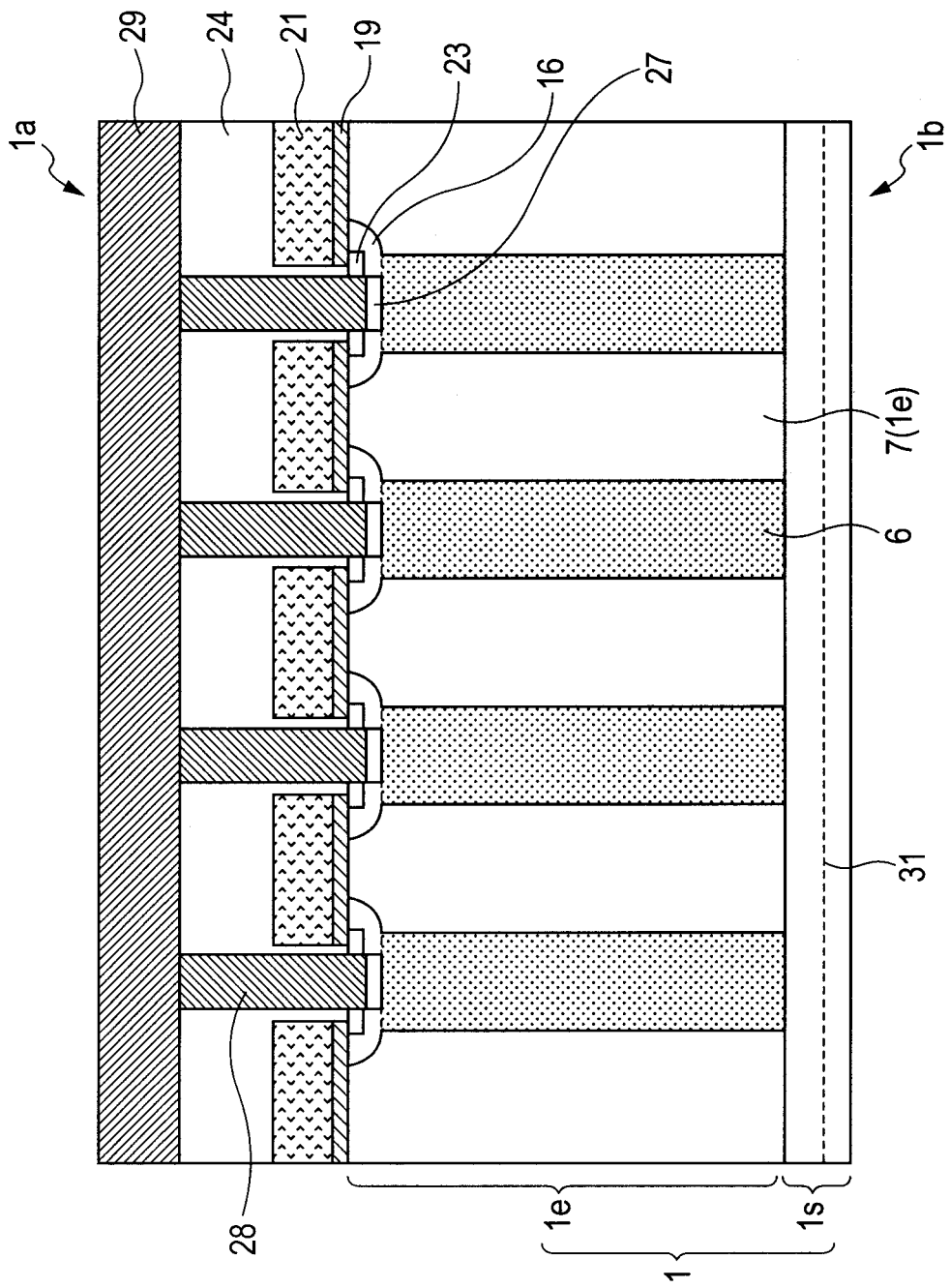
FIG. 16 is a sectional view showing the active cell part R2 of the device region shown in FIG. 11 at a subsequent wafer processing step (step of forming a source metal electrode)
Figure 17:
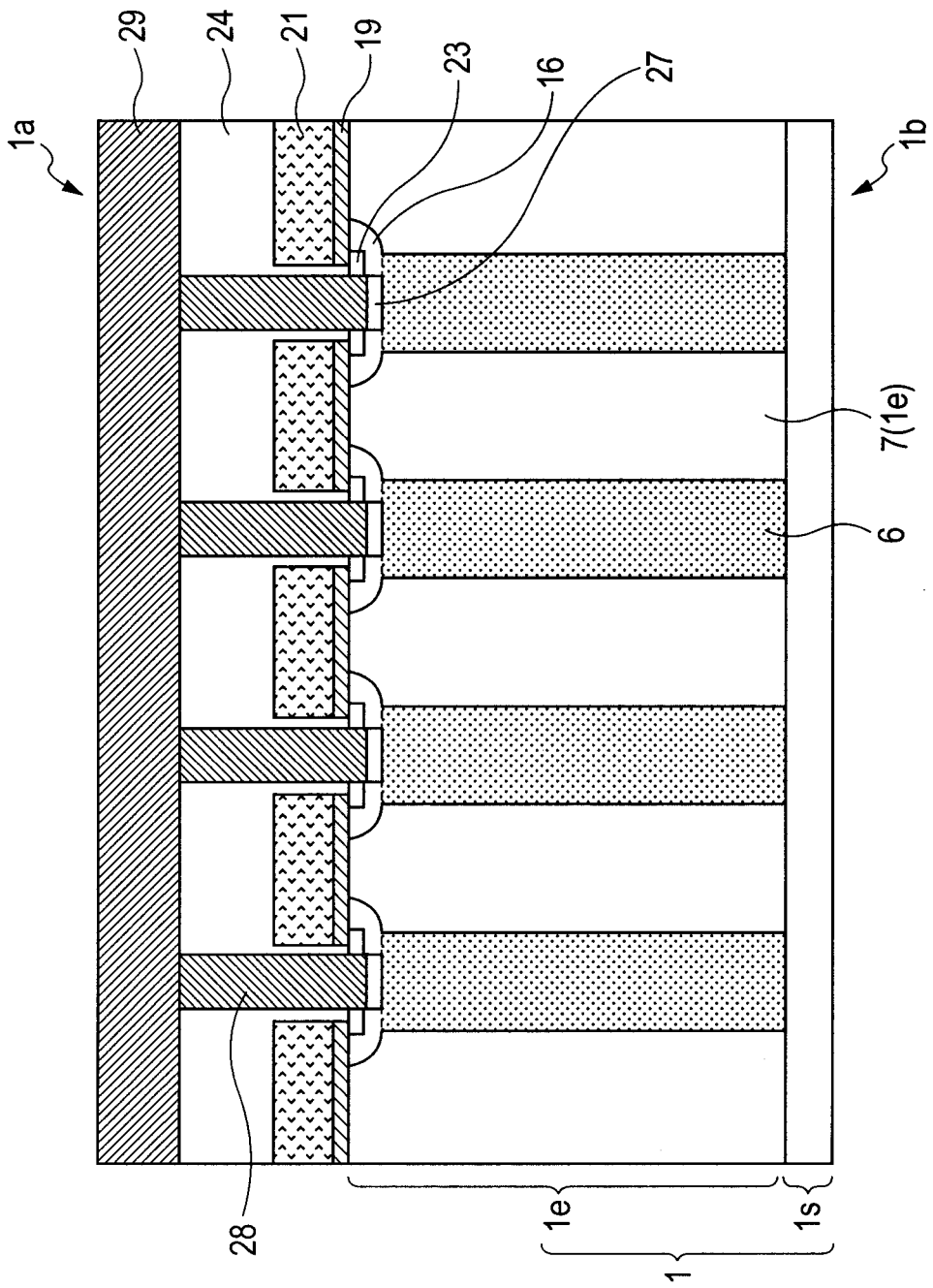
FIG. 17 is a sectional view showing the active cell part R2 of the device region shown in FIG. 11 at a subsequent wafer processing step (back grinding step)
Figure 18:
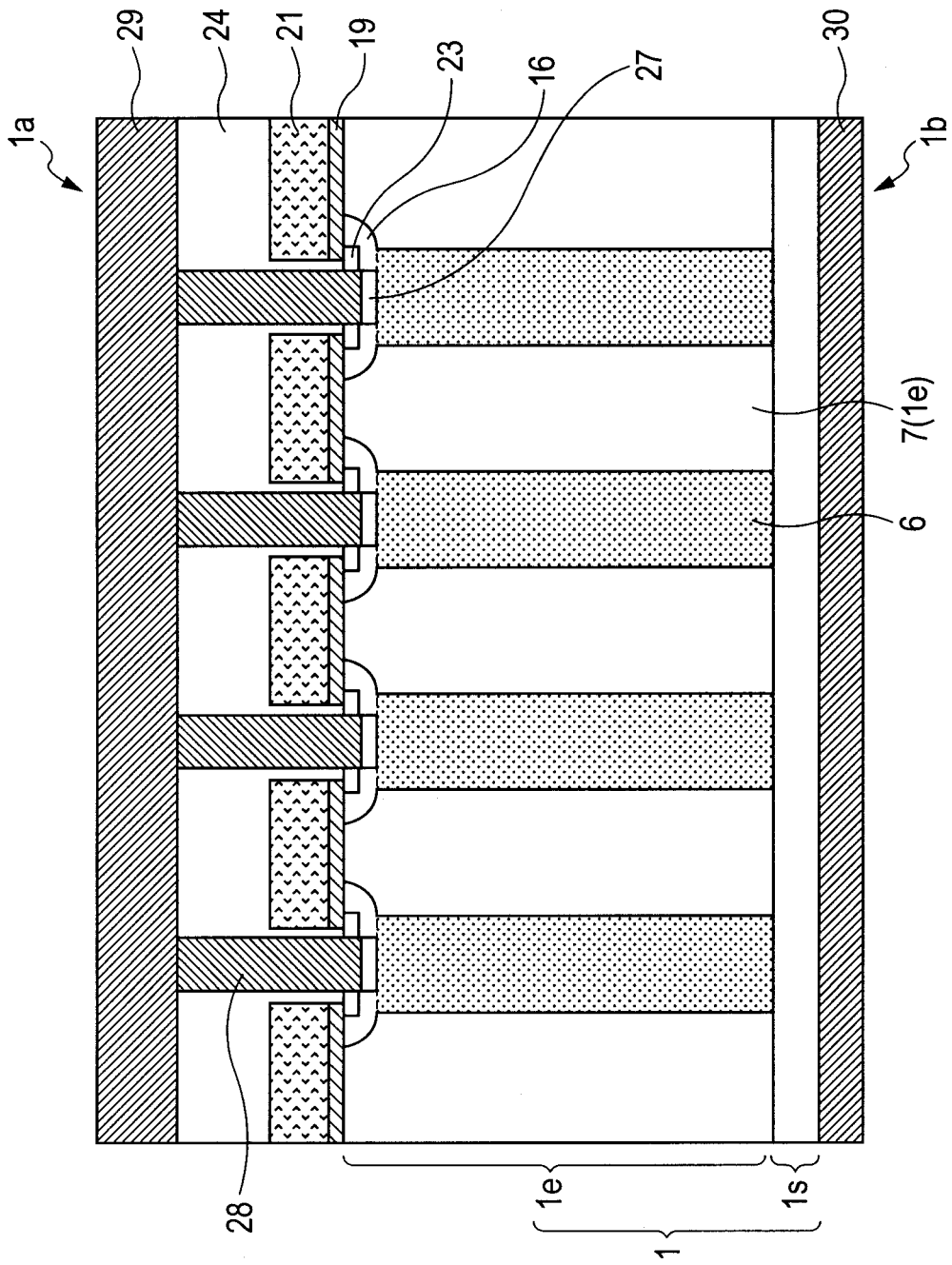
FIG. 18 is a sectional view showing the active cell part R2 of the device region shown in FIG. 11 at a subsequent wafer processing step (step of forming a back metal electrode)

FIG. 4 is a sectional view showing the device region 3, temporary alignment mark region 4, and alignment mark region 5 at a wafer processing step (step of forming a hard mask film for trench etching) in the semiconductor device manufacturing method according to the embodiment. FIG. 5 is a sectional view showing the device region 3, temporary alignment mark region 4, and alignment mark region 5 at a wafer processing step (trench etching step) in the semiconductor device manufacturing method according to the embodiment. FIG. 6 is a sectional view showing the device region 3, temporary alignment mark region 4, and alignment mark region 5 at a wafer processing step (trench filling step) in the semiconductor device manufacturing method according to the embodiment. FIG. 7 is a sectional view showing the device region 3, temporary alignment mark region 4, and alignment mark region 5 at a wafer processing step (first planarization step) in the semiconductor device manufacturing method according to the embodiment. FIG. 8 is a sectional view showing the device region 3, temporary alignment mark region 4, and alignment mark region 5 at a wafer processing step (resist film coating step for forming alignment marks) in the semiconductor device manufacturing method according to the embodiment. FIG. 9 is a sectional view showing the device region 3, temporary alignment mark region 4, and alignment mark region 5 at a wafer processing step (step of forming alignment marks) in the semiconductor device manufacturing method according to the embodiment. FIG. 10 is a sectional view showing the device region 3, temporary alignment mark region 4, and alignment mark region 5 at a wafer processing step (step of removing the hard mask) in the semiconductor device manufacturing method according to the embodiment. FIG. 11 is a sectional view showing the device region 3, temporary alignment mark region 4, and alignment mark region 5 at a wafer processing step (second planarization step) in the semiconductor device manufacturing method according to the embodiment. FIG. 12 is a sectional view showing the active cell part R2 of the device region shown in FIG. 11 at a subsequent wafer processing step (step of forming P type body regions). FIG. 13 is a sectional view showing the active cell part R2 of the device region shown in FIG. 11 at a subsequent wafer processing step (step of forming a gate polysilicon film). FIG. 14 is a sectional view showing the active cell part R2 of the device region shown in FIG. 11 at a subsequent wafer processing step (step of patterning the gate polysilicon film). FIG. 15 is a sectional view showing the active cell part R2 of the device region shown in FIG. 11 at a subsequent wafer processing step (step of making contact holes). FIG. 16 is a sectional view showing the active cell part R2 of the device region shown in FIG. 11 at a subsequent wafer processing step (step of forming a source metal electrode). FIG. 17 is a sectional view showing the active cell part R2 of the device region shown in FIG. 11 at a subsequent wafer processing step (back grinding step). FIG. 18 is a sectional view showing the active cell part R2 of the device region shown in FIG. 11 at a subsequent wafer processing step (step of forming a back metal electrode). The wafer processing steps of the semiconductor device manufacturing method according to the embodiment are described below referring to these figures.

First, as shown in FIG. 4, a semiconductor wafer 1 is prepared in which, for example, a phosphorous-doped N epitaxial layer 1e (drift region with a concentration in the order of $10^{15}/cm^3$ or so) with a thickness T of 45 micrometers or so is formed over an antimony-doped (in the order of $10^{18}$ to $10^{19}/cm^3$ or so) N+ silicon single-crystal substrate is (the wafer diameter is 200 mm in this example; instead the wafer diameter may be 150, 300, or 450 mm). A hard mask film 11 for the formation of trenches for P type columns, for example, of P-TEOS (Plasma-Tetraethylorthosilicate) (for example, with a thickness of 1 micrometer or so) is formed over the device surface 1a (main surface opposite to the back surface 1b) of the semiconductor wafer 1. The hard mask film 11 may be a thermally oxidized film, CVD oxidized film or a combination of these. If its major portion is silicon oxide film, it is acceptable that the rest is another type of insulating film. In this example, the "first conductivity type" is N type and the "second conductivity type" is P type, but the opposite is all right.

Next, as shown in FIG. 5, many trenches 12 for P type columns and trenches 35 for temporary alignment marks are made by dry etching the N epitaxial layer 1e, etc using the hard mask film 11 for the formation of trenches for P type columns as a mask. As etching gas, $CHF_3$, $CF_4$, or $O_2$ gas is used to etch the silicon oxide film and $SF_6$ or $O_2$ gas is used to etch the silicon epitaxial portion.

Next, as shown in FIG. 6, a P type buried epitaxial layer 14 (for example, with a concentration in the order of $10^{15}/cm^3$) is formed by filling the P type column trenches 12 and temporary alignment mark trenches 35 by epitaxial growth. For this step, DCS (dichlorosilane) gas, HCL gas, TCS (trichlorosilane) gas or HCl gas may be used.

Then, as shown in FIG. 7, by carrying out a first planarization process using the hard mask film 11 as the stopper, for example, by CMP (Chemical Mechanical Polishing), the P type epitaxial layer 14 except its portions buried in the P type column trenches 12 and temporary alignment mark trenches 35 is removed and the surface 1a of the semiconductor wafer 1 is flattened. The slurry used here should have a high selectivity ($Si/SiO_2$). Consequently the first group of trenches among the many trenches are filled with the buried epitaxial layer 14.

Then, as shown in FIG. 8, a resist film 15 for the formation of alignment marks is coated virtually all over the front main surface 1a (device main surface, namely first main surface) of the wafer 1. As explained earlier in reference to FIG. 19, alignment for patterning the resist film 15 for the formation of alignment marks is performed by detecting the positions of temporary alignment marks 33 using optical level differenced 41 between temporary alignment marks 33 and their surroundings in the temporary alignment mark region 4 (though the surface is flat, such level differences arise because of optical path length difference due to medium difference). After alignment (step 51 for alignment of alignment marks in FIG. 19), exposure and development are performed. Here, for example, the width of each N type column region 7 is 6 micrometers or so and the width of each P type column region 6 is 4 micrometers or so. Also, the width and spacing of the temporary alignment marks 33 are, for example, 2 micrometers or so. Consequently, among the many buried trenches, a second group of trenches are used as temporary alignment marks to perform alignment in the exposure for the formation of alignment marks and exposure is made based on the temporary alignment marks.

As shown in FIG. 9, alignment marks 8 are formed by dry etching using the patterned resist film 15. After that, the resist film 15 which has become useless is all removed by ashing or a similar technique and the hard mask 11 for trench etching is all removed by wet etching or a similar technique. The alignment marks 8 are thus formed after the formation of the superjunction, which is advantageous as compared with the formation of alignment marks before or at the same time as the formation of the superjunction, in that there is no need to protect the alignment marks. In addition, it is easier to optimize the depth or shape of alignment marks.

The result of the above process is shown in FIG. 10. As shown in FIG. 10, the upper surfaces 36 of the P type column regions or temporary alignment marks (upper level in the level difference) slightly protrude from the upper surface 1a of the wafer 1. The amount of this protrusion, namely level difference d in the device region or temporary alignment mark region before a second polishing process, is, for example, 1 micrometer or so. The width of each alignment mark 8 is, for example, 2 micrometers or so and the depth D1 of each recess (depth of the trench for an alignment mark before the second polishing process) is 5 micrometers or so.

Then, as shown in FIG. 11, a second planarization step is carried out. It is preferable that at this step the depth of removal, namely the amount of second polishing P be about three times as much as the level difference d, so in this example, the amount of second polishing P is 3 micrometers or so. As a result, the depth D2 of an alignment mark 8 after the second planarization step (depth of the trench for the alignment mark after second polishing) is 2 micrometers or so. Since the exact thickness T of the epitaxial layer (for example, 45 micrometers) is known, the depth of the superjunction can be determined accurately by measuring the recess depth D1 and recess depth D2 by an optical or other method, so the depth of the superjunction can be controlled accurately. In other words, since the difference between the recess depths D1 and D2 is equal to the amount of second polishing, a certain superjunction depth can be always obtained by calculating an adequate amount of second polishing P from the measured recess depths D1 and D2 and the measured epitaxial layer thickness T and controlling the amount of polishing. Another advantage is that the amount of polishing for the second planarization process can be minimized.

Hereinafter, the process layers at the following steps are explained referring to sectional views of the active cell part R2 of the device region 3 as shown in FIG. 11.

As shown in FIG. 12, a resist film 17 for the formation of P type body regions is coated and patterning of the film is done (for example, by an ordinary lithographic technique; alignment at this step is performed by detecting the alignment marks 8 as shown in FIG. 19, which corresponds to alignment step 53 for the formation of P type body regions). Using the patterned resist film 17 as a mask, P type body regions 16 (P type channel regions are formed by ion implantation (the ion species here is, for example, boron and its concentration is, for example, in the order of $10^{17}/cm^3$).

Next, as shown in FIG. 13, a gate oxide film 19 is formed over the surface 1a of the semiconductor wafer 1 (for example, by wet oxidation at 950 degrees Celsius) and a gate polysilicon film 21 (phosphorous-doped polysilicon film) is formed over it, for example, by low pressure CVD (Chemical Vapor Deposition). For wafer cleaning before gate oxidization, wet cleaning may be done using a first cleaning liquid, a mixture of ammonia, hydrogen peroxide, and deionized water (volume ratio of 1:1:5) and a second cleaning liquid, a mixture of hydrochloric acid, hydrogen peroxide, and deionized water (volume ratio of 1:1:6).

Then, as shown in FIG. 14, by dry etching a resist film 22 for the formation of gate electrodes (for example, using $SF_6$ pr $O_2$ etching gas for the polysilicon and $CHF_3$ or $CF_4$ etching gas for the oxide film), a pattern of gate electrodes 21 is made (for example, by an ordinary lithographic technique; alignment at this patterning step is performed by detecting the alignment marks 8 as shown in FIG. 19, which corresponds to alignment step 57 for the formation of gate electrodes). Then, N+ source regions 23 are formed by ion implantation (the ion species here is, for example, arsenic and its concentration is, for example, in the order of $10^{20}/cm^3$). Then the resist film 22 which has become useless is all removed. As explained above, the temporary alignment marks 33 are formed simultaneously with the trenches for the formation of P type column regions 6 of the superjunction and the alignment marks 8 for the following steps are aligned to them accurately and alignment in lithography for the formation of gate electrodes is based on these alignment marks 8, so high alignment accuracy is assured at the step of forming gate electrodes Next, as shown in FIG. 15, a PSG (phospho-silicate-glass) film 24 (interlayer insulating film) is formed virtually all over the surface 1a of the semiconductor wafer 1 by CVD or a similar technique (instead an SOG film may be formed over it and planarized). Then, a resist film 25 for source contact holes is formed over the surface 1a of the semiconductor wafer 1 ((for example, by an ordinary lithographic technique; alignment at this step is performed by detecting the alignment marks 8 formed at the step of forming gate electrodes as shown in FIG. 19, which corresponds to alignment step 54 for the formation of contact holes) and using the film as a mask, source contact holes 26, etc are made by dry etching and a P+ body contact region 27 is formed in the bottom of each source contact hole 26 by ion implantation (for example, the ion species is $BF_2$ and its concentration is in the order of $10^{19}/cm^3$). After that, the resist film 26 which has become useless is all removed.

Next, as shown in FIG. 16, a tungsten plug 28 is buried in each source contact hole 26 through a titanium barrier metal film. Then, an aluminum metal layer is formed by sputtering or a similar technique and patterned (for example, by an ordinary lithographic technique; alignment at this step is performed by detecting the alignment marks formed for the formation of contact holes as shown in FIG. 19, which corresponds to alignment step 55 for the formation of source metal electrodes) to form a metal source electrode 29 and a guard ring electrode (FIG. 2). Furthermore, after that, if necessary, an overlying final passivation film (inorganic or organic-inorganic final passivation film) is formed and pad holes and gate holes are made (for example, by an ordinary lithographic technique; alignment at this step is performed by detecting the alignment marks formed for the formation of contact holes as shown in FIG. 19, which corresponds to alignment step 56 for the formation of a passivation film). The final passivation film is typically an inorganic final passivation film or organic-inorganic final passivation film in the form of a single layer film but it may be a laminate in which an organic-inorganic final passivation film or the like lies over an inorganic final passivation film. Then, back grinding is performed up to an upper limit for back grinding so as to decrease the wafer thickness from the initial thickness (equivalent to the substrate thickness, for example, 700 micrometers or so) to a range between 200 and 20 micrometers as required, as shown in FIG. 17.

Then, as shown in FIG. 18, a back metal electrode 30 is formed on the back surface 1b of the wafer 1 by sputtering or a similar technique.

Then, the wafer 1 is divided into individual chip regions 2 by blade dicing (or laser dicing, laser grooving or blade dicing combined with these methods).

3. Summary

The invention made by the present inventors has been so far explained in reference to the preferred embodiments thereof. However, the invention is not limited thereto and it is obvious that these details may be modified in various ways without departing from the spirit and scope of the invention.

In the foregoing explanation of the preferred embodiments, it is assumed that the MOS structure is a planar gate structure; however, the present invention is not limited thereto and obviously it may be applied to a trench type gate structure in the same way. As for layout, in the example given here, MOSFETs are parallel to p and n columns and arranged in a stripe pattern; however, they may be perpendicular to p and n columns or arranged in a grid pattern or another pattern.

In the foregoing explanation of the preferred embodiments, it is assumed that an N channel device is mainly formed over the upper surface of an N epitaxial layer over an N+ silicon single-crystal substrate; however, the present invention is not limited thereto. Instead, a P channel device may be formed over the upper surface of a P epitaxial layer over a P+ silicon single-crystal substrate.

In the foregoing explanation of the preferred embodiments, the device is assumed to be a power MOSFET; however the present invention is not limited thereto. Obviously it may be applied to a power device with a superjunction structure, namely a diode, bipolar transistor, and IGBT (Insulated Gate Bipolar Transistor). Also it is obvious that the invention may be applied to a semiconductor integrated circuit which incorporates a power MOSFET, diode, bipolar transistor or IGBT.

Furthermore, in the foregoing explanation of the preferred embodiments, it is assumed that the trench fill method is used to form the superjunction structure; however the invention is not limited thereto. The multi-epitaxial method or the like may be used instead.

What is claimed is:

1. A method for manufacturing a semiconductor device comprising the steps of:
    (a) dry etching a first main surface of a semiconductor substrate of a first conductivity type to make many trenches in the main surface of the semiconductor substrate;
    (b) forming a buried epitaxial layer over the first main of the semiconductor substrate surface through buried epitaxial growth in the first main surface by filling the trenches with an epitaxial layer of a second conductivity type, opposite to the first conductivity type;
    (c) performing a first planarization process over the first main surface by removing the buried epitaxial layer over the first main surface of the semiconductor substrate except the trenches so that a first group of trenches among the filled trenches, along with the semiconductor substrate of the first conductivity type around them, make up a superjunction structure;
    (d) after the above step (c), forming an alignment mark in the first main surface of the semiconductor substrate; and
    (e) after the above step (d) performing alignment using the alignment mark, wherein the alignment mark includes a recess made in the first main surface of the semiconductor substrate; and
    (f) after the step (c) and before the step (d), performing alignment for the step (d) using a second group of trenches among the many trenches as temporary alignment marks.

2. The method for manufacturing a semiconductor device according to claim 1, wherein the dry etching at the step (a) and the buried epitaxial growth at the step (b) are performed while a hard mask film lies over the first main surface of the semiconductor substrate.

3. The method for manufacturing a semiconductor device according to claim 2, wherein the hard mask film includes a silicon oxide insulating film as a main component.

4. The method for manufacturing a semiconductor device according to claim 3, further comprising the step of:
    (g) after the step (d) and before the step (e), removing the hard mask film.

5. The method for manufacturing a semiconductor device according to claim 4, further comprising the step of:
    (h) performing a second planarization process over the first main surface of the semiconductor substrate to eliminate a level difference in the first main surface of the semiconductor substrate resulting from the removal of the hard mask film at the step (g).

6. The method for manufacturing a semiconductor device according to claim 5, further comprising the step of:
    (i) measuring a depth of the recess before and after the second planarization process at the step (h).

7. The method for manufacturing a semiconductor device according to claim 6, further comprising the step of:
    (j) controlling an amount of polishing in the second planarization process at the step (h) based on a result of measurement of the depth of the recess before and after the second planarization process at the step (i).

8. The method for manufacturing a semiconductor device according to claim 7, wherein the second group of trenches among the many trenches are located separately from the first group of trenches among the many trenches.

9. The method for manufacturing a semiconductor device according to claim 8, wherein the second group of trenches among the many trenches are located adjacent to the alignment marks.

10. The method for manufacturing a semiconductor device according to claim 9, wherein the alignment marks have a plurality of linear recesses arranged virtually parallel.

11. The method for manufacturing a semiconductor device according to claim 10, wherein the alignment process at the step (e) is an alignment process for patterning to form a gate electrode.

12. The method for manufacturing a semiconductor device according to claim 11, wherein optical level differences around the temporary alignment marks on a flat surface subjected to the first planarization are used in performing alignment using the temporary alignment marks.

* * * * *